United States Patent
Renn et al.

Patent Number: 5,263,868
Date of Patent: Nov. 23, 1993

[54] FLEXIBLE CIRCUIT INTERFACE FOR COPLANAR PRINTED CIRCUIT BOARDS

[75] Inventors: Robert M. Renn, Pfafftown; Keith L. Volz, Jamestown; Frederick R. Deak, Kernersville; David C. Johnson; Warren A. Bates, both of Winston-Salem, all of N.C.

[73] Assignee: The Whitaker Corporation, Wilmington, Del.

[21] Appl. No.: 28,059

[22] Filed: Mar. 8, 1993

[51] Int. Cl.$^5$ .............................. H01R 9/09
[52] U.S. Cl. ........................ 439/67; 439/77; 439/329; 439/493
[58] Field of Search .............. 439/67, 74, 77, 329, 439/493

[56] References Cited

U.S. PATENT DOCUMENTS

| | | | |
|---|---|---|---|
| 4,538,865 | 9/1985 | Wakabayashi et al. | 439/67 |
| 4,690,472 | 9/1987 | Elco et al. | 439/67 |
| 4,695,258 | 9/1987 | Hanson et al. | 439/329 |
| 4,913,656 | 4/1990 | Gordon et al. | 439/67 |
| 4,934,946 | 6/1990 | Ordway | 439/77 |
| 4,975,068 | 12/1990 | Squires | 439/67 |
| 5,009,607 | 4/1991 | Gordon et al. | 439/67 |
| 5,026,290 | 6/1991 | Dery | 439/67 |
| 5,161,981 | 11/1992 | Deak et al. | 439/67 |
| 5,205,740 | 4/1993 | Frankeny et al. | 439/67 |

Primary Examiner—Paula A. Bradley

[57] ABSTRACT

An interface for connecting coplanar printed circuit ("PC") boards (10, 20) using a flexible jumper circuit (50) for bridging the PC boards (10, 20), a base (80) underlying the second PC board and integrally attached thereto, and a support housing (30) with compression plugs (60) which may be tightened against base (80) for securing the two PC boards (10, 20) and for compressing the flexible jumper circuit (50) against the two PC boards (10, 20). The interface is precision aligned by a plurality of guide pins (34) which protrude from support housing (30) and conform to guide holes in the two PC boards (10, 20) and the flexible jumper circuit (50). Guide pins (34) fix the relative positions of the boards (10, 20) and circuit (50) within their respective planes. The resilient compression plugs (60) maintain contact between the flexible jumper circuit (50) and the two PC boards (10, 20) despite irregularities in thickness, and the guide pins 34 maintain precision horizontal alignment between the contact pads (12, 22) on the two PC boards (10, 20) and the conductive traces (52) on the flexible jumper circuit (50).

15 Claims, 3 Drawing Sheets

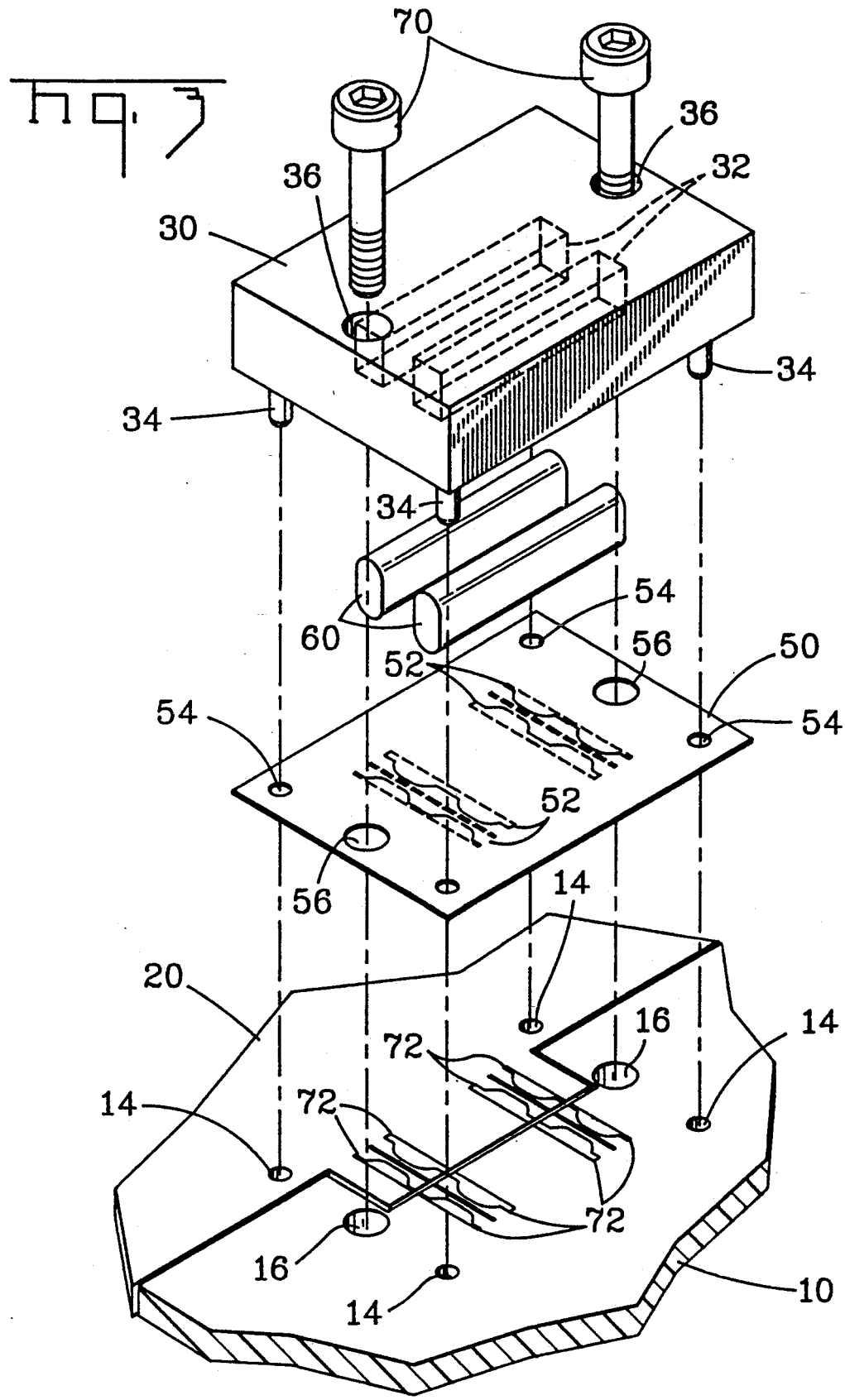

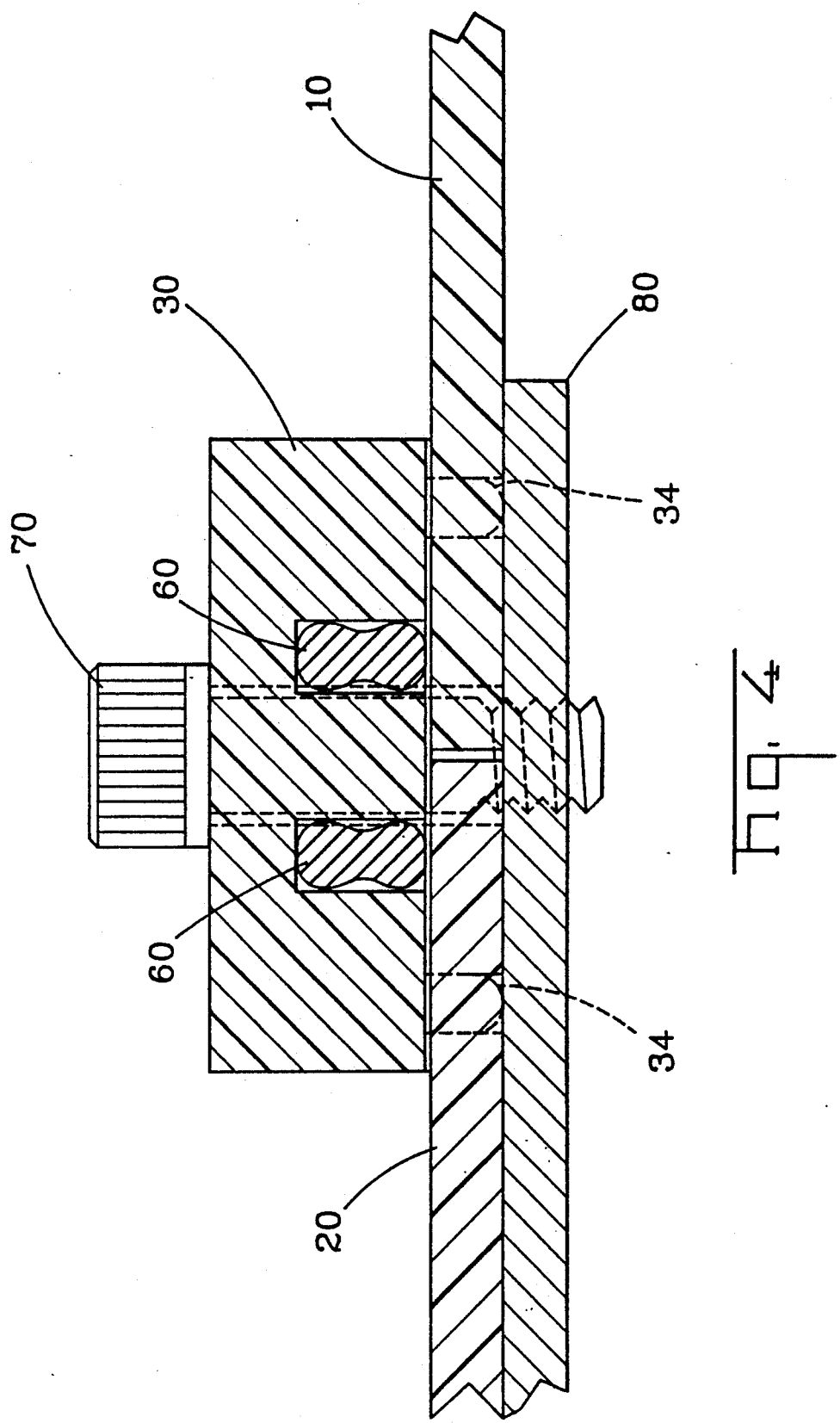

FLEXIBLE CIRCUIT INTERFACE FOR COPLANAR PRINTED CIRCUIT BOARDS

FIELD OF THE INVENTION

The present invention relates to the interconnection of coplanar printed circuit boards and, in particular, to a precision interface which accurately connects the respective traces of two coplanar circuit boards via a flexible jumper circuit.

BACKGROUND OF THE INVENTION

It is often desirable to interface two printed circuit boards while maintaining a coplanar orientation. This requires a plurality of conductive jumpers to bridge the respective traces (or contact pads) of the two circuit boards, as well as a removable support assembly to lock the circuit boards together and to hold the jumpers in place against the appropriate traces or pads.

As circuit boards evolve toward higher densities, it is becoming increasingly difficult to complete a junction as described above. With current photolithographic techniques, the contact pads on a circuit board can be precisely formed on the underlying board. Hence, the typical pitch between contact pads rarely exceeds 1 mm. If reliable contact is to be made between the contact pads of two such boards, then the pads of one board must be precisely positioned relative to those of the other board, and the conductive jumpers which bridge the boards must be precisely aligned therebetween. The need for precision is heightened even further when controlled impedance requirements are imposed on the junction.

Certain applications impose controlled impedance requirements ranging between 50 to 120 ohms for each point of electrical contact. Conventional impedance control is achieved by varying the following:

1. the shape of the contact pads or traces;
2. the distance between contact pads/traces;
3. the signal-to-ground structure; and
4. the dielectric constant of the insulating board material.

In a co-planar PC board interface, all of the above-referenced factors are upset when the alignment is improper. As a result, the impedance constraints are more difficult to achieve.

Consequently, it remains a vexing problem to properly interface two coplanar high-density printed circuit boards, especially in a controlled impedance application.

SUMMARY OF THE INVENTION

The present invention provides an improved interface for impermanent coplanar connection of two printed circuit ("PC") boards. An underlying base is attached beneath the first PC board such that a ledge protrudes from the board. The second PC board is seated on the ledge adjacent to the first PC board. A flexible jumper circuit bridges the two PC boards, and a plurality of conductive jumpers is provided on the flexible jumper circuit for electrically connecting the contact pads of the first PC board to the contact pads of the second PC board. A support housing is secured over the two PC boards with the flexible jumper circuit compressed therebetween, and the support housing is anchored by screws, pylons or the like through the second PC board to the protruding ledge of the base. The support housing fixes the relative vertical positions of the two PC boards in a substantially coplanar relation. In order to fix the relative horizontal positions of the PC boards and the flexible jumper circuit with necessary precision, the support housing is provided with a plurality of guide pins which conforms to guide holes in the two PC boards and the flexible circuit board. The guide pins protrude downwardly from the support housing through guide holes in the flexible jumper circuit and into guide holes in the two PC boards.

The guide holes formed in the two PC boards can be precisely positioned relative to the respective contact pads. Likewise, the guide holes in the flexible jumper circuit can be precisely positioned relative to the conductive jumpers thereon. With the present invention, the guide pins formed on the support housing are capable of integrating the above-described relationships into a precise overall alignment of the conductive jumpers between the contact pads of the first PC board to the contact pads of the second PC board.

In addition, a plurality of elastomeric compression plugs may be seated in the underside of the support housing to resiliently bias the flexible jumper circuit against the two PC boards. The compression plugs maintain the conductive jumpers of the flexible jumper circuit in electrical contact with the contact pads of the two PC boards and thereby accommodate any differences in thickness between the two PC boards.

Other advantages and results of the invention are apparent from a following detailed description by way of example of the invention and from the accompanying drawings.

BRIEF DESCRIPTION OF THE DRAWINGS

FIG. 3 is an exploded perspective view of the interface FIG. 1.

FIG. 4 is a cross-sectional view of the interface of FIG. 1.

DETAILED DESCRIPTION OF THE INVENTION

Figure 1:
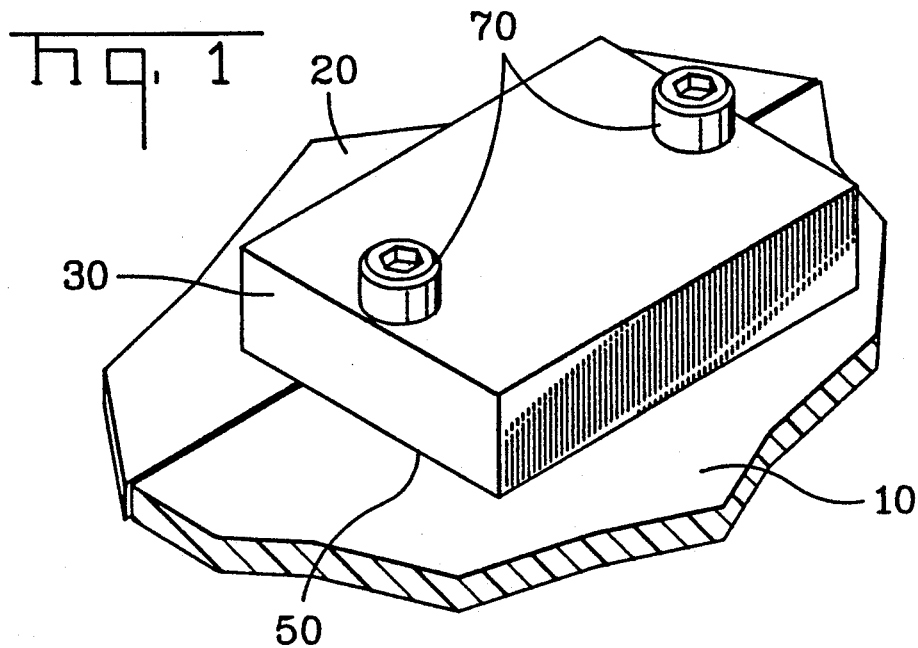
FIG. 1 is a perspective view of an exemplary interface for connecting two coplanar printed circuit ("PC") boards 10 and 20 in accordance with the present invention.

With more particular reference to the drawings, FIG. 1 illustrates a perspective view of an interface for connecting two co-planar printed circuit ("PC") boards according to the present invention.

The two PC boards include a first PC board 10 and a second PC board 20 which are electrically and mechanically joined at the interface. The electrical interface is completed by a flexible jumper circuit 50 which is formed with a plurality of discrete conductive traces for bridging the two PC boards 10 and 20.

Figure 2:
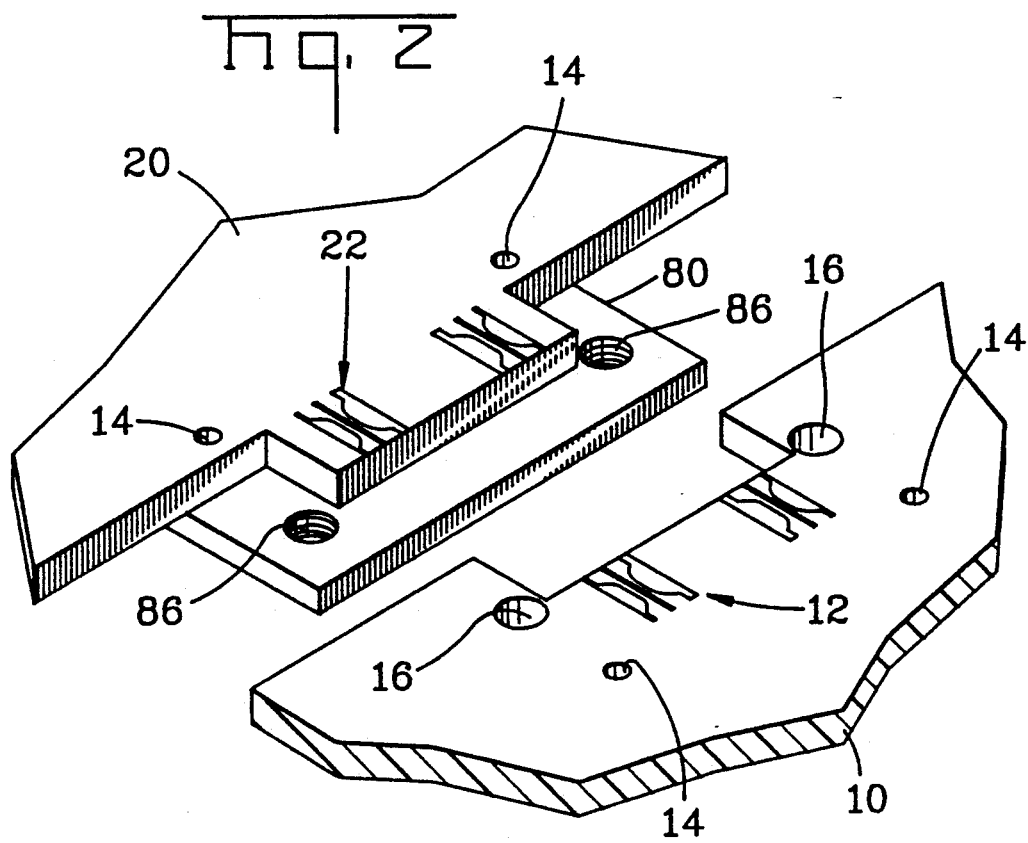
FIG. 2 is a perspective view of two cooperating PC boards 10 and 20 as in FIG. 1 which further illustrates an underlying base 80 which is integrally attached beneath the second PC board 20 to profile a protruding ledge for seating the first PC board 10.

As shown in FIG. 2, the two PC boards 10 and 20 are preferably formed to cooperate along a common edge to facilitate docking. For instance, a notch may be formed along the mating edge of the first PC board 10 as shown, and the second PC board 20 may be formed with a corresponding projection along its mating edge which fits into the notch.

The first PC board 10 is formed with a plurality of conductive traces 12 which is exposed along the mating edge to allow interconnection. Likewise, second PC board 20 is provided with a corresponding plurality of conductive traces 22 exposed along its mating edge. Preferably, the circuit traces 12 of the first PC board 10 are exposed inwardly of the notch, and the circuit traces 22 of the second PC board 20 are exposed along the projection. This way, the exposed traces 12 and 22 of the respective PC boards 10 and 20 are roughly aligned when the projection of board 20 is docked within the notch of board 10.

The mechanical interface is completed (and the electrical interface is maintained) by a support housing 30 which overlies the junction and compresses the jumper circuit 50 against the two PC boards 10 and 20, and by an underlying base 80 which is integrally attached beneath the second PC board 20 to provide a foundation for the support housing 30. Base 80 is attached to the second PC board such that it forms a protruding ledge. Base 80 may be any structure capable of providing a flat ledge as shown. However, it is most convenient if base 80 is a blank PC board which is fused, glued, riveted, bolted, or otherwise attached beneath the second PC board. The first PC board 10 is seated on the ledge provided thereby.

To effect a proper interface, each conductive trace 12 must be electrically connected with a corresponding conductive trace 22 via flexible jumper circuit 50. This way, he proper trace-to-trace connections are established across the two PC boards 10 and 20.

FIG. 3 is an exploded perspective view of the interface of FIG. 1 which shows how the support housing 30 fixes the relative vertical positions of the two PC boards 10 and 20 in a substantially coplanar relation with the flexible jumper circuit compressed against them.

As illustrated, support housing 30 may be a rectilinear structure with a flat undersurface facing the PC boards 10 and 20.

The flexible jumper circuit 50 is formed with a plurality of conductive jumper traces 52. Jumper circuit 50 is positioned to overlay the junction of the two PC boards 10 and 20 such that the conductive jumper traces 52 traverse the two boards 10 and 20. Each conductive jumper trace 52 is pressed into contact with corresponding traces 12 and 22, and each conductive jumper 52 establishes an electrical path from one conductive trace 22 on the second PC board 20 to corresponding conductive trace 12 on the first PC board 10. The jumper traces 52 on flexible jumper circuit 50 are pressed into contact by support housing 30.

The invention accommodates tolerances in all dimensions of the two PC boards 10 and 20. Thickness differentials are accommodated in the following manner.

Support housing 30 is integrally secured by a plurality of anchors 70 which may be, for example, conventional hex bolts, pylons, or other mounting means. Anchors 70 are passed through mounting holes 36 in the support housing 30, mounting holes 56 in the flexible jumper circuit 50, and finally, mounting holes 16 in the first PC board 10. The anchors 70 are then secured in holes 86 in base 80.

As illustrated, support housing 30 is anchored only to the base 80 which underlies the second PC board 20. The first PC board 10 is free to float vertically while the support housing 30 is tightened against the base 80. The first PC board 10 floats until it is firmly compressed between the support housing 30 and second PC board 20. This way, the thickness of the first PC board 10 may vary with respect to the second PC board 20 throughout the tightening procedure.

In addition, the undersurface of support housing 30 is interrupted by a plurality of channels 32. A plurality of elastomeric compression plugs 60 may be seated in channels 32 in the underside of the support housing 30 to resiliently bias the flexible jumper circuit 50 against the two PC boards 10 and 20. Compression plugs 60 may be formed of any suitable non-conducting elastomer such as, for instance, silicon rubber. In the illustrated embodiment, a pair of elongate compression plugs 60 is seated within two channels 32 in support housing 30 to span the respective ends of conductive jumper traces 52. To complete the interface, support housing 30 is overlaid across the two PC boards 10 and 20 with flexible jumper circuit 50 sandwiched underneath. A resilient bias is maintained across the flexible jumper circuit 50 by the elastomeric compression plugs 60, and this maintains the conductive jumpers 52 in electrical contact with the contact pads 12 and 22 of the two PC boards despite any thickness differential and/or other non-uniformity across the co-planar surfaces of the two PC boards 10 and 20.

Given current photolithographic techniques, it is contemplated that the density of the conductive traces 12 and 22 as arranged along the edge of the PC boards 10 and 20 will not exceed one millimeter in pitch. The tight pitch spacing of the contact pads 12 and 22 coupled with the large horizontal tolerances in the dimensions of the PC boards 10 and 20 greatly complicates alignment of the flexible jumper circuit 50. Specifically, the support housing 30 and flexible jumper circuit 50 must be capable of overcoming the horizontal tolerances in order to maintain the stringent alignment needed for a proper interface. In order to fix the relative horizontal positions of the PC boards 10 and 20 and the flexible jumper circuit 50 with necessary precision, the support housing 30 is provided with a plurality of guide pins 34. In addition, the jumper circuit 50 is formed with a corresponding plurality of guide holes 54 which effect alignment of the jumper circuit 50, and the first and second PC boards 10 and 20 are likewise formed with a corresponding plurality of guide holes 14 which insure alignment with jumper circuit 50 and support housing 30. The guide pins 34 of support housing 30 conform to the guide holes 54 in the flexible circuit board 50 and downwardly therethrough into the corresponding guide holes 14 in the two PC boards.

It should be noted that pins 34 of support housing 30 are held captive in guide holes 54 and 14 and thereby provide the necessary lateral restraint. However, guide pins 34 and guide holes 54 and 14 provide no additional vertical restraint.

The guide holes 14 formed in the two PC boards 10 and 20 can be formed at a precise position relative to the respective contact pads 12 and 22. Likewise, the guide holes 54 in the flexible jumper circuit 50 can be precisely formed relative to the conductive jumpers 52 thereon. With the present invention, the guide pins 34 formed on the support housing 30 are capable of integrating the board-specific alignments into a precise overall alignment of the conductive jumpers 52 between the contact pads 12 of the first PC board 10 to the contact pads 22 of the second PC board 20.

FIG. 4 is a cross-sectional view of the assembled interface of FIG. 1 which further illustrates the manner by which the support housing 30 is secured to the base 80 by passing anchors 70 through the flexible jumper circuit 50 and the first PC board 10. As explained, the anchors 70 freely penetrate the flexible jumper circuit 50 and the first PC board 10. The holes 16, 36, and 56 are oversized to allow a degree of lateral freedom ("float"). In addition, the first PC board 10 is free to float vertically until the anchors 70 are fully tightened. The vertical float coupled with the lateral float provides the overall freedom necessary to direct the guide pins 34 of support housing 30 into the flexible jumper circuit 50, the first PC board 10, and the second PC board 20 prior to tightening of the anchors 70.

Tightening of anchors 70 biases the flexible jumper circuit 50 against the two PC boards 10 and 20, and the compression plugs 60 maintain the conductive jumpers 52 of the flexible jumper circuit 50 in electrical contact with the contact pads 12, 22 of the two PC boards despite differences in thickness. In addition, a precise horizontal alignment is maintained from the contact pads 12 of the first PC board 10 to the contact pads 22 of the second PC board 20 via the conductive jumpers 52.

The precision of the horizontal alignment which may be achieved using the above-described invention is sufficient for strict controlled impedance constraints.

Having now fully set forth a detailed example and certain modifications incorporating the concept underlying the present invention, various other modifications will obviously occur to those skilled in the art upon becoming familiar with said underlying concept. It is to be understood, therefore, that within the scope of the appended claims, the invention may be practiced otherwise than as specifically set forth herein.

We claim:

1. An interface for connecting coplanar printed circuit ("PC") boards comprising:
    a flexible jumper circuit including a plurality of conductive jumpers incorporated thereon for bridging corresponding traces on a first PC board and a second PC board;
    a base underlying said first PC board and protruding therefrom such that a ledge is extended for seating the second PC board adjacent to the first PC board;
    a support housing for securing said first PC board and said second PC board in a substantially coplanar relation with said flexible jumper circuit electrically coupled therebetween, said support housing being overlaid across said first and second PC boards with said flexible jumper circuit sandwiched beneath, and said support housing being anchored to the underlying base for compressing the flexible jumper circuit against said first and second PC boards, said support housing further including a plurality of guide pins which conform to guide holes in the first and second PC boards and flexible jumper circuit for fixing their relative positions within a plane of said boards;
    a plurality of elastomeric compression plugs seated within said support housing for biasing the conductive jumpers on said flexible jumper circuit against the respective traces on said first and second PC boards; and
    a plurality of anchors for securing said support housing against said first and second PC boards with said flexible jumper circuit sandwiched therebetween, said compression plugs maintaining the conductive jumpers on said flexible jumper circuit in electrical contact with the respective traces on said first and second PC boards despite any differences in thickness between said boards.

2. The interface according to claim 1 wherein said flexible jumper circuit introduces a controlled impedance.

3. The interface according to claim 1 wherein said support housing is formed with a flat undersurface interrupted by a parallel pair of elongate channels, and said elastomeric compression plugs comprise two plugs formed as elongate crosspieces which are seated within the respective channels.

4. The interface according to claim 3 wherein said flexible PC board is formed with a plurality of conductive jumpers each for traversing said first and second PC boards, and each elastomeric compression plug compresses one end of all the conductive jumpers against a corresponding one of said first and second PC boards.

5. The interface according to claim 3 wherein said plurality of anchors comprises posts which freely penetrate said support housing, flexible jumper circuit, and first PC board, said posts being tightenable thereagainst for compressing said support housing against said first and second PC boards with said flexible jumper circuit sandwiched therebetween.

6. The interface according to claim 5 wherein said base is a blank circuit board underlying said first and second PC boards for mooring said plurality of anchor posts.

7. The interface according to claim 5 wherein said anchor posts are threaded into said base.

8. An interface comprising:
    a first PC board formed with a notch along one edge and a plurality of circuit traces exposed inwardly of said notch;
    a second PC board formed with a projecting section along one edge and a plurality of circuit traces exposed along said projecting section;
    a flexible jumper circuit including a plurality of conductive jumpers incorporated thereon for bridging corresponding traces from the notch of said first PC board to the projecting section of said second PC board;
    a base underlying said first PC board and protruding therefrom such that a ledge is extended for seating the second PC board adjacent to the first PC board;
    a support housing for securing said first PC board and said second PC board in a substantially coplanar relation with said flexible jumper circuit electrically coupled therebetween, said flexible jumper circuit being sandwiched against said first and second PC boards by said support housing, and said support housing including a plurality of guide pins which conforms to guide holes in the first and second PC boards and flexible PC board for fixing a relative position within a plane of said boards;
    a plurality of resilient compression plugs seated within said support housing for biasing the conductive jumpers on said flexible jumper circuit against the respective traces on said first and second PC boards; and
    a plurality of anchors for securing said support housing against said first and second PC boards with said flexible jumper circuit sandwiched therebetween, said compression plugs maintaining the conductive jumpers on said flexible jumper circuit in electrical contact with the respective traces on said first and second PC boards despite any differences in thickness, between said boards.

9. The interface according to claim 8 wherein said flexible jumper circuit introduces a controlled impedance.

10. The interface according to claim 8 wherein said support housing is overlaid across said first and second PC boards with said flexible jumper circuit sandwiched beneath, and said support housing may be tightened against the underlying base for compressing the flexible jumper circuit against said first and second PC boards.

11. The interface according to claim 10 wherein said support housing is formed with a flat undersurface interrupted by a parallel pair of elongate channels, and said compression plugs comprise two elastomeric plugs formed as elongate crosspieces which may be seated within said channels.

12. The interface according to claim 10 wherein said flexible jumper circuit is formed with a plurality of conductive jumpers each for traversing said first and second printed circuits boards, and each elastomeric compression plug biases one end of all the conductive jumpers against a corresponding one of said first and second PC boards.

13. The interface according to claim 10 wherein said first and second PC boards are each formed with a plurality of guide holes, and said support housing is formed with a plurality of guide pins extending downwardly from the underside for alignment in said guide holes.

14. The interface according to claim 10 wherein said plurality of anchors comprises posts which penetrate said support housing and flexible jumper circuit and are anchored in said base for securing said support housing against said PC boards with said flexible jumper circuit sandwiched therebetween.

15. The interface according to claim 14 wherein said base further comprises a blank circuit board.

* * * * *